(12) United States Patent
Lin et al.

(10) Patent No.: US 10,679,932 B2
(45) Date of Patent: Jun. 9, 2020

(54) SEMICONDUCTOR PACKAGE AND A SUBSTRATE FOR PACKAGING

(71) Applicant: Siliconware Precision Industries Co., Ltd., Taichung (TW)

(72) Inventors: Chang-Fu Lin, Taichung (TW); Ho-Yi Tsai, Taichung (TW); Chin-Tsai Yao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 250 days.

(21) Appl. No.: 15/499,446

(22) Filed: Apr. 27, 2017

(65) Prior Publication Data
US 2017/0294371 A1    Oct. 12, 2017

Related U.S. Application Data

(62) Division of application No. 13/546,281, filed on Jul. 11, 2012, now Pat. No. 9,666,453.

(30) Foreign Application Priority Data

May 11, 2012 (TW) .............................. 101116800 A

(51) Int. Cl.
| | | |
|---|---|---|
| *H01L 21/00* | (2006.01) | |
| *H01L 23/00* | (2006.01) | |
| *H01L 23/498* | (2006.01) | |
| *H01L 21/56* | (2006.01) | |
| *H01L 23/29* | (2006.01) | |
| *H01L 23/31* | (2006.01) | |
| *H01L 23/367* | (2006.01) | |

(52) U.S. Cl.
CPC ...... *H01L 23/49838* (2013.01); *H01L 21/563* (2013.01); *H01L 23/293* (2013.01);
(Continued)

(58) Field of Classification Search
CPC ............... H01L 21/563; H01L 21/5486; H01L 21/54853; H01L 23/49838; H01L 23/49827; H01L 23/3675; H01L 23/3142; H01L 23/293; H01L 24/16; H01L 24/73; H01L 24/32; H01L 24/06; H01L 24/29; H01L 2224/73204; H01L 2224/2919; H01L 2224/16227; H01L 2224/0401; H01L 2224/32225; H01L 2924/35121; H01L 2924/00; H01L 2924/00014; H01L 2924/181; H01L 2924/48227
See application file for complete search history.

(56) References Cited

U.S. PATENT DOCUMENTS

5,394,303 A * 2/1995 Yamaji ..................... H05K 1/00
361/749
5,710,071 A * 1/1998 Beddingfield ........ H01L 21/563
257/778
(Continued)

*Primary Examiner* — Nikolay K Yushin
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a substrate having a metal pattern layer; a semiconductor die formed on the substrate; and an underfill filled between the substrate and the semiconductor die. At least an opening is formed in the metal pattern layer to reduce the area of the metal pattern layer on the substrate, thereby reducing the contact area between the underfill and the metal pattern layer, hence eliminating the underfill delamination.

16 Claims, 5 Drawing Sheets

(52) U.S. Cl.
CPC ...... *H01L 23/3142* (2013.01); *H01L 23/3675* (2013.01); *H01L 23/49827* (2013.01); *H01L 24/06* (2013.01); *H01L 24/16* (2013.01); *H01L 24/32* (2013.01); *H01L 24/73* (2013.01); *H01L 24/29* (2013.01); *H01L 2224/0401* (2013.01); *H01L 2224/16227* (2013.01); *H01L 2224/2919* (2013.01); *H01L 2224/32225* (2013.01); *H01L 2224/73204* (2013.01); *H01L 2924/35121* (2013.01)

(56) References Cited

U.S. PATENT DOCUMENTS

| | | | | |
|---|---|---|---|---|
| 6,150,726 A | * | 11/2000 | Feilchenfeld | G03F 7/00 257/668 |
| 6,317,333 B1 | * | 11/2001 | Baba | H01L 21/563 174/255 |
| 6,613,606 B1 | * | 9/2003 | Lee | H01L 21/563 257/E21.503 |
| 7,902,660 B1 | * | 3/2011 | Lee | H01L 21/4857 257/698 |
| 8,445,325 B2 | * | 5/2013 | Do | H01L 21/6836 438/113 |
| 8,900,921 B2 | * | 12/2014 | Kim | H01L 24/29 438/109 |
| 2004/0035840 A1 | | 2/2004 | Koopmans | |
| 2005/0110168 A1 | | 5/2005 | Chuang | |
| 2007/0221400 A1 | | 9/2007 | Kurashina et al. | |
| 2010/0148316 A1 | * | 6/2010 | Kim | H01L 21/6835 257/621 |
| 2012/0261689 A1 | * | 10/2012 | Appelt | H01L 21/4832 257/98 |

* cited by examiner

SEMICONDUCTOR PACKAGE AND A SUBSTRATE FOR PACKAGING

CROSS-REFERENCE TO RELATED APPLICATIONS

This application is a divisional of copending application U.S. Ser. No. 13/546,281, filed on Jul. 11, 2012, which claims under 35 U.S.C. § 119(a) the benefit of Taiwanese Patent Application No. 101116800, filed on May 11, 2012, the entire contents of which are incorporated herein by reference.

BACKGROUND OF THE INVENTION

1. Field of the Invention

The present invention relates to semiconductor packages, and, more particularly, to a semiconductor package having a metal pattern layer, and a substrate with a metal pattern layer for the semiconductor package.

2. Description of Related Art

FIG. 1 shows a conventional flip-chip semiconductor package 1. Referring to FIG. 1, a substrate 10 having a dielectric layer 100, electric traces 101 and a solder mask layer 102 is provided, and a semiconductor die 11 is attached on the substrate 10 through a plurality of bumps 111. Then, an underfill 12 is filled between the semiconductor die 11 and the substrate 10 for encapsulating the bumps 111. The underfill 12 binds to the solder mask layer 102 quite well, thereby eliminating delamination of the underfill 12 from the substrate 10.

Electronic products are intended to evolve towards multi-functional, high performance and miniaturized. For a substrate 10 having fine-pitch electrical circuits, the substrate 10 has not only fine-pitch electrical circuits (having an electrical line width of about 12 um), but also large-size grounding portions having a diameter greater than 200 um and electrical circuits having an electrical line width greater than 20 um.

Although the solder mask layer 102 of the substrate 10 can prevent the electric traces 101 from oxidating, the formation of the solder mask layer 102 increases the thickness of the substrate 10 and makes it difficult for the overall structure to meet the miniaturization requirement.

Accordingly, a flip-chip substrate that does not have a solder mask layer is provided. Referring to FIG. 2A, a substrate 20 having a dielectric layer 200, electric traces 201 and a plurality of pads 201a is provided, and a semiconductor die 21 is attached on the pads 201a of the substrate 20 through a plurality of bumps 211. Then, an underfill 22 is filled between the semiconductor die 21 and the substrate 20 encapsulating the bumps 211 to form a semiconductor package 2. The underfill 22 can cover the electric traces 201 to prevent the electric trace 201 from oxidizing.

Furthermore, the substrate 20 has a large-size metal pattern layer 202 formed thereon for improving the thermal dissipation efficiency and providing an electrical grounding for the semiconductor die 21.

However, since the underfill 22 binds to the dielectric layer 200 quite well but to metal materials poorly, if a large contact area exists between the underfill 22 and the metal materials such as the electric traces 201 and the metal pattern layer 202, then underfill delamination is likely to occur.

Accordingly, a semiconductor package 2' as disclosed by U.S. Pat. No. 7,808,113 is provided. Referring to FIG. 2B, an adhesion promoter layer 203 is formed on the electric traces 201' and the metal pattern layer 202 of a substrate 20'. Since the underfill 22 binds to the adhesion promoter layer 203 quite well, underfill delamination is thus eliminated. However, the surfaces of all metal materials except the pads 201a must be roughened to form organometallic surfaces that serve as the adhesion promoter layer 203. Therefore, the fabrication cost and time are increased and the fabrication process becomes more complicated.

Alternatively, the adhesion promoter layer 203 can be formed by depositing a silane coupling agent on surfaces of the metal materials. Since the surfaces of the electric trace 201' and the metal pattern layer 202 are not even due to, for example, through holes 201b, it is not easy to control the thickness of the adhesion promoter layer 203. In addition, such a fabrication process is also expensive, complicated and time-consuming.

Therefore, it is inevitable that there is a demand to provide a semiconductor package and a substrate for packaging to overcome the above-mentioned disadvantages.

SUMMARY OF THE INVENTION

In view of the above-mentioned disadvantages, the present invention provides a semiconductor package, which comprises: a substrate having a dielectric layer on a surface thereof, and at least a metal pattern layer and a plurality of electric traces formed on the dielectric layer, wherein at least an opening in the metal pattern layer is formed; a semiconductor die attached on the substrate in a flip-chip manner and electrically coupled to the electric traces; and an underfill filled between the substrate and the semiconductor die to bind the dielectric layer, the semiconductor die, the electric traces, and the metal pattern layer together.

The present invention provides another semiconductor package, which comprises: a substrate having a dielectric layer on a surface thereof, and at least a metal pattern layer and a plurality of electric traces formed on the dielectric layer, wherein at least an opening in the metal pattern layer is formed; a semiconductor die attached on the substrate in a flip-chip manner and electrically coupled to the electric trace, wherein the semiconductor die is free from covering the metal pattern layers; and an underfill filled between the substrate and the semiconductor die to bind together the dielectric layer, the semiconductor die, and the electric trace, except the metal pattern layer.

The present invention further provides a substrate for packaging, which comprises: a substrate body having a dielectric layer; a plurality of electric traces formed on the dielectric layer; and at least a metal pattern layer formed on the dielectric layer and at least an opening formed in the metal pattern layer.

In the above-mentioned semiconductor package and substrate, the opening can occupy 35% to 60% of the total area of the metal pattern layer.

In the above-mentioned semiconductor package and substrate, the dielectric layer can be exposed to the underfill through the opening of the metal pattern layer.

In the above-mentioned package and substrate, the opening can be formed at an edge side of the metal pattern layer or formed in an inner surface region of the metal pattern layer to be away from any edge side of the metal pattern layer.

In the above-mentioned package and substrate, the metal pattern layer can be used for electrical grounding or thermal dissipation.

In an embodiment, the substrate has at least a through hole for being electrically coupled to the electric traces, and the electric traces have a plurality of pads electrically coupled to the semiconductor die. In an embodiment, the semiconductor die is electrically coupled to the pads through a plurality of bumps which are encapsulated by the underfill.

In the above-mentioned package and substrate, the underfill can comprise an epoxy resin material.

Therefore, by forming at least an opening in the metal pattern layer, the present invention reduces the area of the metal pattern layer on the substrate to reduce the contact area between the underfill and the metal pattern layer, thus increasing the contact area between the underfill and the dielectric layer, thereby effectively eliminating the underfill delamination phenomena.

Further, the process for forming the opening has advantages of simplicity, low cost and less time consumption, thus making it highly applicable to the mass production.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are not intended to limit the present invention. Various modification and variations can be made without departing from the spirit of the present invention. Further, terms such as "on", "one" etc. are merely for illustrative purposes and should not be construed to limit the scope of the present invention.

Figure 1:
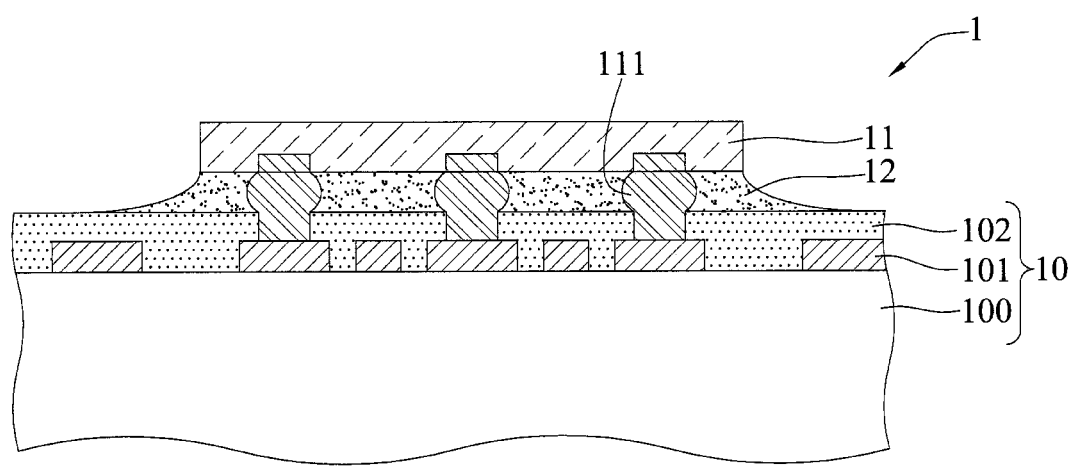
FIGS. 1, 2A and 2B are cross-sectional views of conventional semiconductor packages.
Figure 2A:
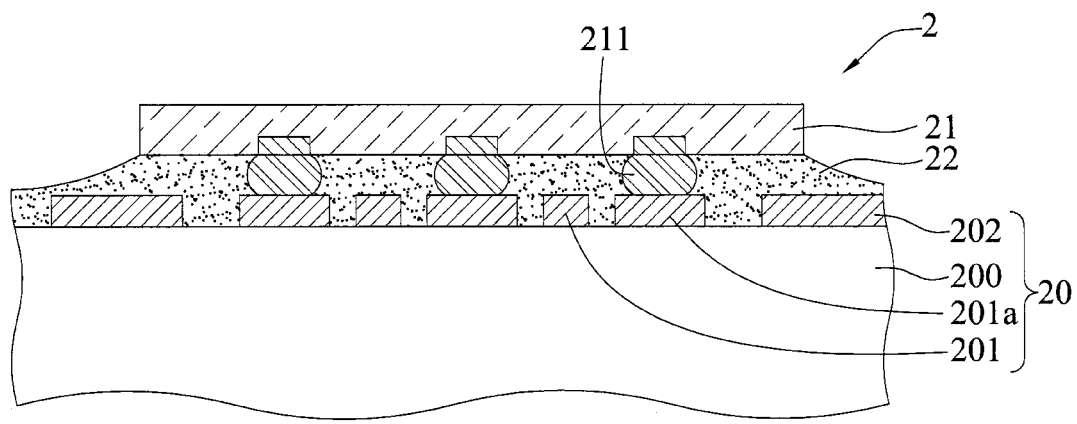
Figure 2B:
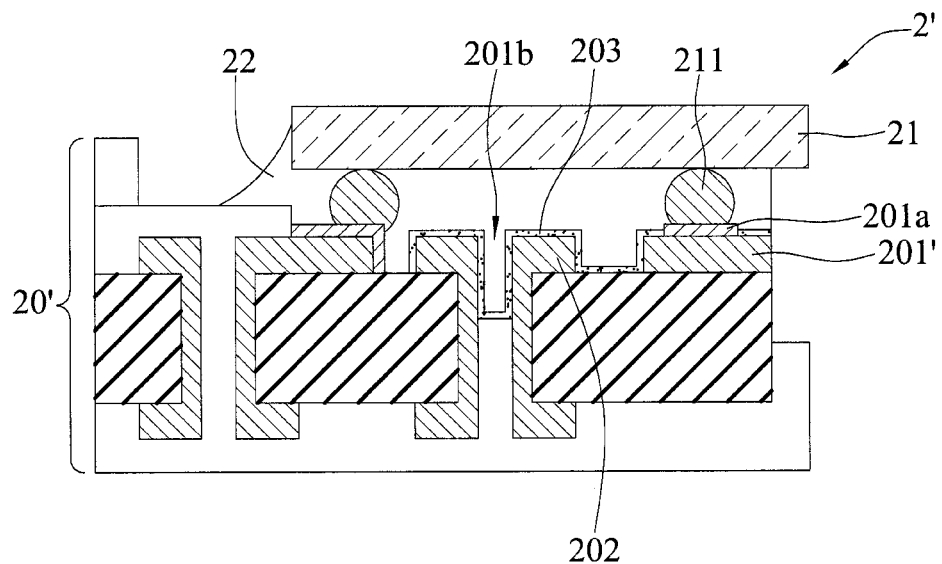
Figure 3:
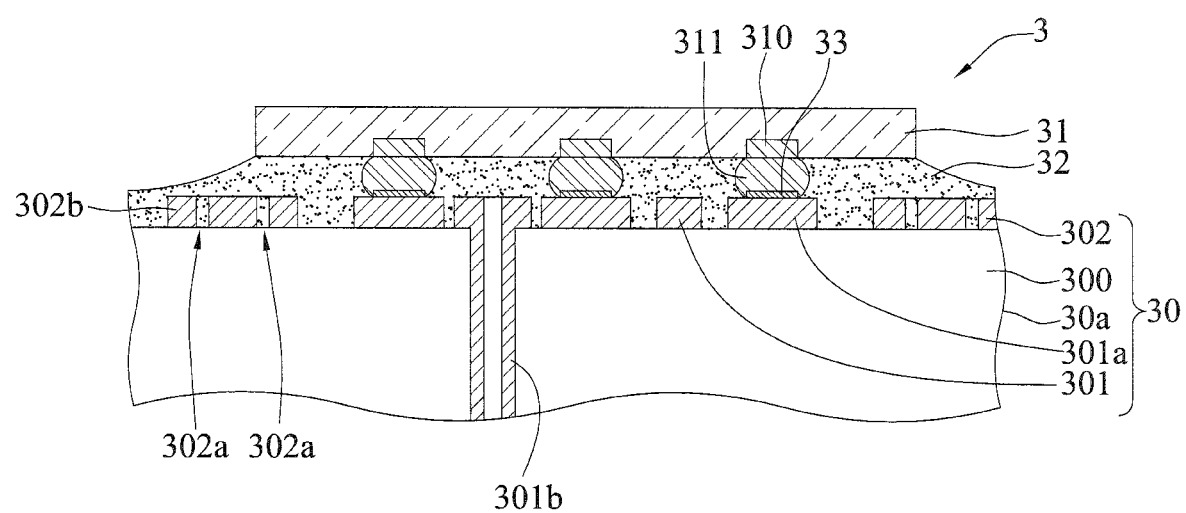
FIG. 3 is a cross-sectional view illustrating a semiconductor package according to the present invention.

FIG. 3 is a cross-sectional view illustrating a semiconductor package 3 according to the present invention. Referring to FIG. 3, the semiconductor package 3 has a substrate 30, a semiconductor die 31 attached on the substrate 30 in a flip-chip manner, and an underfill 32 filled between the substrate 30 and the semiconductor die 31.

The substrate 30 has a substrate body 30a, at least a dielectric layer 300 formed on the substrate body 30a, and a plurality of electric traces 301 and at least a pattern layer 302 formed on the dielectric layer 300. A metal layer 302b has at least an opening 302a to form the pattern layer 302. The dielectric layer 300 is exposed to the underfill 32 through the opening 302a. The pattern layer 302 is not electrically connected with the electric traces 301.

In the present embodiment, the substrate body 30a has at least a through hole 301b electrically coupled to the electric traces 301. The electric traces 301 have a plurality of pads 301a. The pattern layer 302 can be made of copper or aluminum.

Further, a surface treatment layer 33 can be formed on the pads 301a. The surface treatment layer 33 can be made of one selected from the group consisting of electroplated Ni/Au, electroless Ni/Au, ENIG, ENEPIG immersion tin and OSP.

Figure 4A:
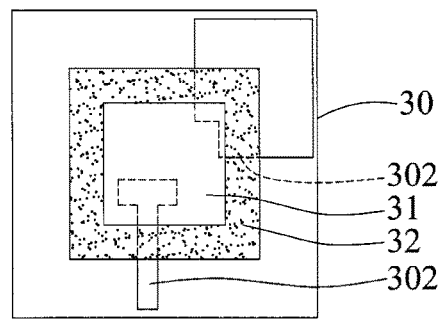
FIGS. 4A to 4D are top plan views illustrating a semiconductor package according to various embodiments of the present invention.
Figure 4B:
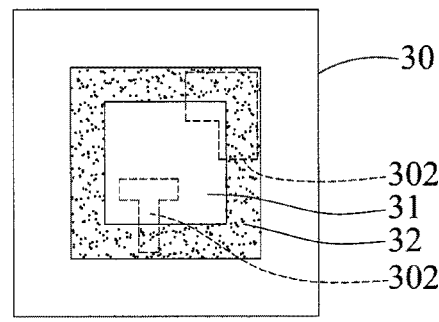
Figure 4C:
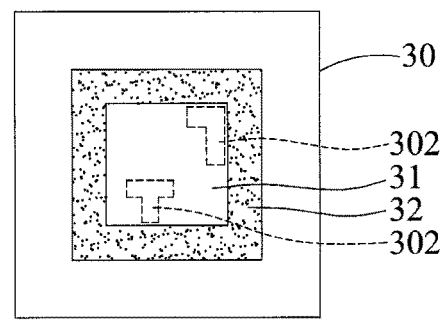

FIGS. 4A to 4C are top plan views illustrating distribution of the pattern layer 302. Since being used for improving thermal dissipation efficiency and providing, for example, an electrical grounding, the pattern layer 302 can be formed at different regions of the die attached area according to various packaging requirements. The distribution of the pattern layer 302 is not limited to the drawings. In FIGS. 4A to 4C, the die attached area is defined as a region where the underfill 32 is disposed.

The substrate body 30a can be made of a laminated material, which can be a bismaleimide-triazine (BT) resin or an ajinomoto build up film (ABF).

The semiconductor die 31 has a plurality of electrode pads 310 electrically coupled to the pads 301a through a plurality of bumps 311. As such, the semiconductor die 31 is attached on the substrate 30 in a flip-chip manner.

In the present embodiment, the semiconductor die 31 is electrically grounded with the pattern layer 302.

The underfill 32 not only encapsulates the bumps 311 but also binds the electric traces 301, the metal pattern layer 302, and the dielectric layer 300 together.

In the present embodiment, the underfill 32 comprises an epoxy resin material.

The opening 302a formed in the metal layer 302b reduces the area of the metal layer 302b to reduce the contact area between the underfill 32 and the pattern layer 302, thus increasing the contact area between the underfill 32 and the dielectric layer 300, thereby effectively eliminating the underfill delamination phenomena.

The underfill delamination can be effectively eliminated when the ratio of the area of the opening 302a (or the part of the metal layer 302b removed) to the total area of the metal layer 302b (i.e., the removed part of the metal layer 302b and the residual part of the metal layer 302b) ranges from 35% to 60%. The ratio is referred to as the opening area ratio, which is defined as the ratio of the area of openings to the total area of the metal layer 302b.

The process for forming openings is well known in the art. Therefore, by taking advantage of modern technologies to form the opening 302a in the metal layer 302b, the present invention can provide a semiconductor package 3 solution for much simpler, less expensive, and less time-consuming fabrication processes. In addition, the fabrication process will not be adversely affected by the uneven surface of the pattern layer 302, thereby making it suitable for mass production.

Figure 4D:
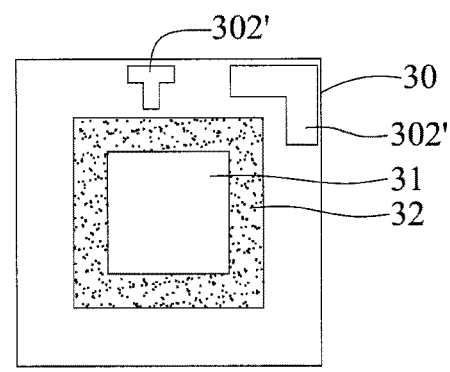

In another embodiment, referring to FIG. 4D, the pattern layer 302' is disposed completely outside the die attached area so as not to be covered by the semiconductor die 31. As such, the underfill 32 does not bind to the pattern layer 302', thus reducing the contact area between the underfill 32 and the pattern layer 302'.

Figure 5A:
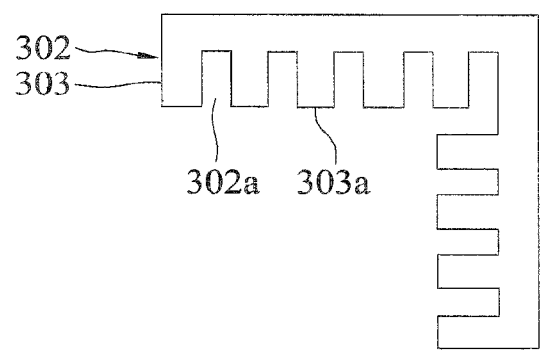
FIGS. 5A to 5C are top plan views illustrating a metal pattern layer of a substrate according to various embodiments of the present invention.
Figure 5B:
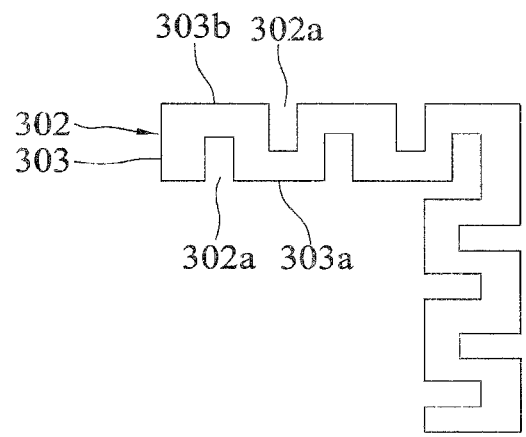

Referring to FIGS. 5A and 5B, a plurality of openings 302a can be formed to open at least one side of an edge 303 of the metal layer 302b. In FIG. 5A, the openings 302a are formed along an inner side 303a of the edge 303 of the metal layer 302b. Alternatively, in FIG. 5B, the openings 302a are formed along the inner side 303a and an outer side of the edge 303 of the metal layer 302b.

Figure 5C:
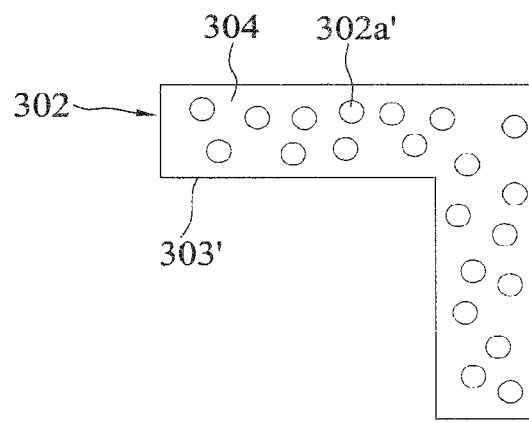

Further, referring to FIG. 5C, a plurality of openings 302a' are located in an inside region 304 of the metal layer 302b to be away from an edge 303' of the metal layer 302b.

In the present embodiment, the metal pattern layer 302 is in an L-shape. But it should be noted that there is absolutely no special limitation on the shape of the metal pattern layer 302.

The ends of the openings 302a and 302a' can be circular, rectangular, triangular, square, cross-shaped, star-shaped, oval-shaped, polygonal-shaped, or the like.

Therefore, by forming at least an opening in the metal pattern layer to expose a portion of the dielectric layer to the underfill, the present invention reduces the area of the metal pattern layer on the substrate to reduce the contact area between the underfill and the metal pattern layer and increase the contact area between the underfill and the dielectric layer, thereby effectively eliminating the underfill delamination phenomena.

Furthermore, the process for forming the opening has the advantages of simplicity, low cost and less time consumption, thus making it more ideal for mass production.

The above-mentioned descriptions of the detailed embodiments are provided to illustrate the preferred implementation according to the present invention, and are not intended to limit the scope of the present invention. Accordingly, many modifications and variations completed by those with ordinary skill in the art will fall within the scope of present invention as defined by the appended claims.

What is claimed is:

1. A semiconductor package, comprising:
a substrate having a dielectric layer formed on a surface thereof, at least a metal pattern layer formed on the dielectric layer and formed with at least an opening, and a plurality of electric traces formed on the dielectric layer, wherein the metal pattern layer has no circuit function and is not electrically connected with the electric traces;
a semiconductor die attached on the substrate in a flip-chip manner and electrically coupled to the electric traces; and
an underfill filled between the substrate and the semiconductor die to bind the dielectric layer, the semiconductor die, and the electric traces except the metal pattern layer together.

2. The semiconductor package of claim 1, wherein the dielectric layer is exposed from the opening.

3. The semiconductor package of claim 1, wherein the opening occupies 35% to 60% of the area of the metal pattern layer.

4. The semiconductor package of claim 1, wherein the opening is formed at an edge side of the metal pattern layer.

5. The semiconductor package of claim 1, wherein the opening is formed on an inner surface region of the metal pattern layer.

6. The semiconductor package of claim 1, wherein the metal pattern layer is used for electrical grounding or thermal dissipation.

7. The semiconductor package of claim 1, wherein the substrate has at least a through hole electrically coupled to the electric traces, and the electric traces have a plurality of pads electrically coupled to the semiconductor die.

8. The semiconductor package of claim 7, wherein the semiconductor die is electrically coupled to the pads through a plurality of bumps that are encapsulated by the underfill.

9. The semiconductor package of claim 1, wherein the underfill is made of an epoxy resin material.

10. A substrate for packaging, comprising:
a substrate body having a dielectric layer;
a plurality of electric traces formed on the dielectric layer; and
at least a metal pattern layer formed on the dielectric layer and formed with at least an opening, wherein the metal pattern layer has no circuit function and is not electrically connected with the electric traces.

11. The substrate of claim 10, wherein the dielectric layer is exposed through the opening.

12. The substrate of claim 10, wherein the opening occupies 35% to 60% of the area of the metal pattern layer.

13. The substrate of claim 10, wherein the opening is formed at an edge side of the metal pattern layer.

14. The substrate of claim 10, wherein the opening is formed on an inner surface region of the metal pattern layer.

15. The substrate of claim 10, wherein the metal pattern layer is used for electrical grounding or thermal dissipation.

16. The substrate of claim 10, wherein the substrate has at least a through hole electrically coupled to the electric traces, and the electric traces have a plurality of pads electrically coupled to a semiconductor die.

* * * * *